United States Patent
Sakai

(10) Patent No.: US 10,784,860 B1
(45) Date of Patent: Sep. 22, 2020

(54) GATE DRIVER AND SEMICONDUCTOR MODULE

(71) Applicant: Mitsubishi Electric Corporation, Tokyo (JP)

(72) Inventor: Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/738,661

(22) Filed: Jan. 9, 2020

(30) Foreign Application Priority Data

Apr. 17, 2019 (JP) .................................. 2019-078487

(51) Int. Cl.
H03K 17/687 (2006.01)
H02M 1/08 (2006.01)

(52) U.S. Cl.
CPC .......... *H03K 17/6871* (2013.01); *H02M 1/08* (2013.01)

(58) Field of Classification Search
None
See application file for complete search history.

(56) References Cited

U.S. PATENT DOCUMENTS

| 6,222,355 B1* | 4/2001 | Ohshima | ............ H03K 17/0822 323/282 |
| 2008/0018366 A1* | 1/2008 | Hanna | ............ H03K 19/018521 327/112 |

FOREIGN PATENT DOCUMENTS

| JP | H08-129426 A | 5/1996 |
| JP | 2017-204970 A | 11/2017 |
| JP | 2018-133892 A | 8/2018 |

\* cited by examiner

*Primary Examiner* — Cassandra F Cox
(74) *Attorney, Agent, or Firm* — Studebaker & Brackett PC

(57) ABSTRACT

A gate driver includes a first transistor and a second transistor connected in series between a first and a second power supply line, connection nodes thereof are output nodes of the gate driver, the first and second transistors being configured to operate in a complementary manner, a power supply circuit for applying an offset voltage to a source of the transistor, and a switching circuit for performing switching control to apply the offset voltage output from the power supply circuit to the source of the transistor or to apply the second potential to the source of the transistor. The switching circuit is configured to switch so as to apply the offset voltage to the source of the transistor in accordance with a timing of turning off the gate of the transistor and to apply the second potential to the source in accordance with a timing of turning on the gate.

6 Claims, 6 Drawing Sheets

F I G. 5
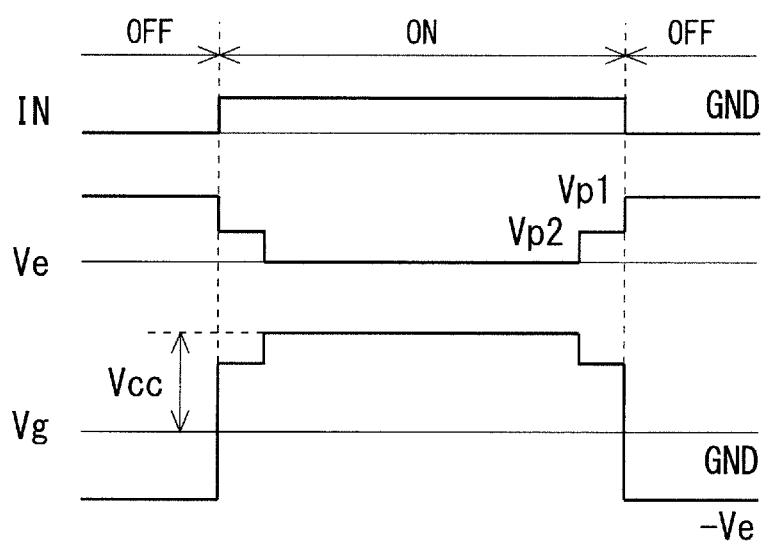

US 10,784,860 B1

GATE DRIVER AND SEMICONDUCTOR MODULE

BACKGROUND OF THE INVENTION

Field of the Invention

The present invention relates to a gate driver, and more particularly to a gate driver for driving a gate of a transistor having a low gate threshold voltage.

Description of the Background Art

A case where the threshold voltage of the transistor is 0 V or less, or is a voltage at a level of lowness where malfunction may be caused due to noise or the like is concerned even if the threshold voltage is 0V or more, the malfunction that the transistor is turned on during the off-state is suppressed by applying a negative bias to the transistor source to increase the threshold voltage substantially.

When the threshold voltage becomes substantially high in this manner, the gate driver needs to output a voltage obtained by adding a negative bias voltage to the gate voltage necessary for the gate drive in order to turn on the transistor. For this reason, increase in the maximum rating of the input power supply voltage of the gate driver or reduction in the variation margin of the input power supply voltage is required, accordingly, there have been problems in that cost is increased or improvement of the quality of the power supply is required, which leads to a high design load.

As an example of the negative bias power supply, there is a configuration in which a negative bias is selectively generated by resistance dividing as disclosed in Japanese Patent Laid-Open No. 8-129426. However, with such power source generation, there has been a problem in that desired voltage and current could not be secured.

SUMMARY

Provided is a gate driver capable of reducing a design load and ensuring a desired voltage and current without increasing the maximum rating of the input power supply voltage of the gate driver.

A gate driver according to the present invention is a gate driver configured to drive a gate of a transistor, including a first transistor and a second transistor connected in series between a first power supply line to which a first potential is applied and a second power supply line to which a second potential lower than the first potential, connection nodes thereof are output nodes of the gate driver, the first transistor and the second transistor being configured to operate in a complementary manner, a power supply circuit for applying an offset voltage to a source of the transistor, and a switching circuit for performing switching control to apply the offset voltage output from the power supply circuit to the source of the transistor or to apply the second potential to the source of the transistor. The switching circuit is configured to switch so as to apply the offset voltage to the source of the transistor in accordance with a timing of turning off the gate of the transistor and to apply the second potential to the source of the transistor in accordance with a timing of turning on the gate of the transistor.

According to the above gate driver, the offset voltage is applied to the source of the transistor in accordance with the timing of turning off the gate of the transistor, and the second potential is switched to be applied to the source of the transistor in accordance with the timing of turning on the gate. Therefore, even for a transistor having a low threshold voltage, it is not necessary to increase the maximum rating of the input power supply voltage of the gate driver. Also, a design load can be reduced and a desired voltage and current can be secured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram illustrating sequences of signals input to and output from the gate driver according to Embodiment 2 of the present invention;

DESCRIPTION OF THE PREFERRED EMBODIMENTS

Embodiment 1

Figure 1:
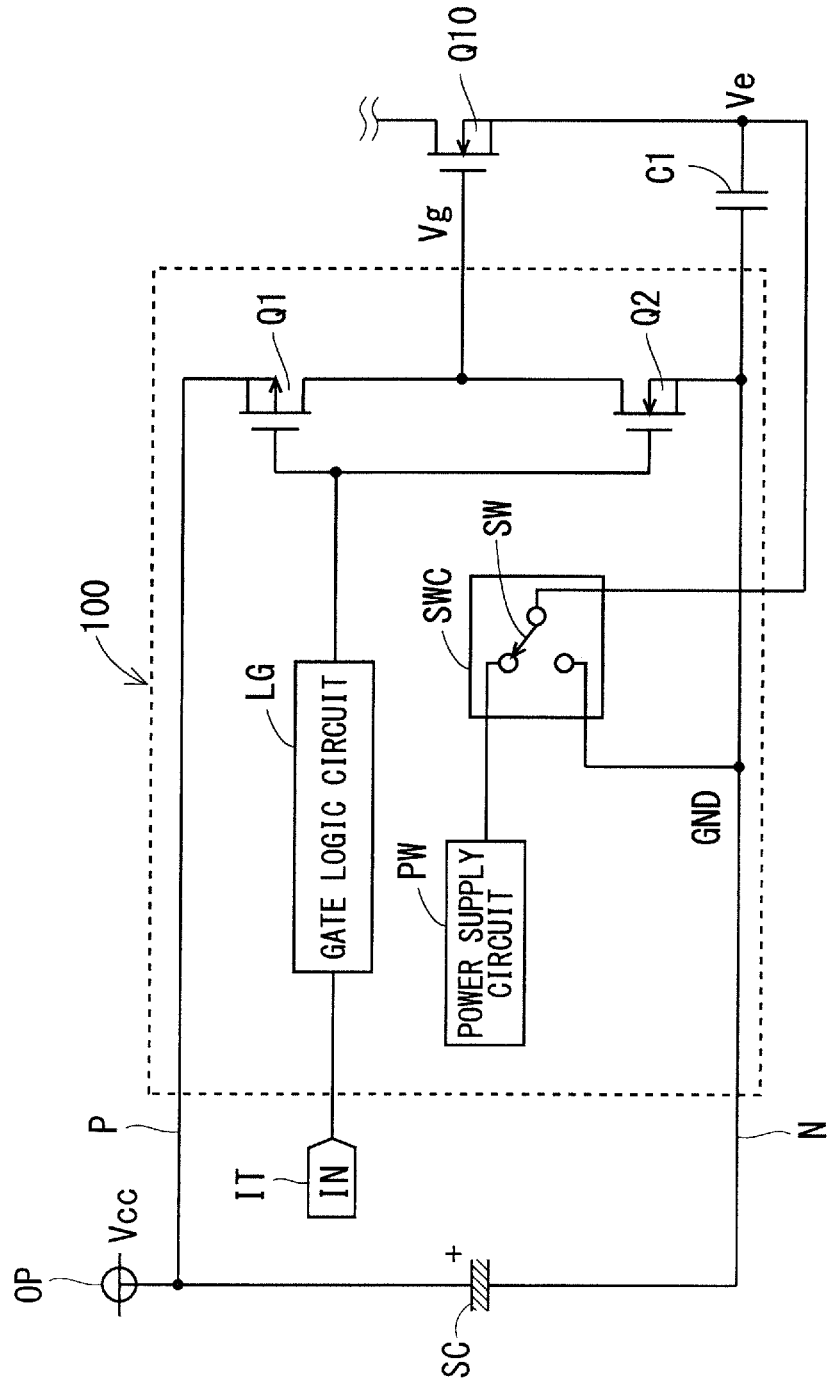
FIG. 1 is a circuit diagram illustrating a configuration of a gate driver according to Embodiment 1 of the present invention.

FIG. 1 is a circuit diagram illustrating a configuration of a gate driver according to Embodiment 1 of the present invention. As illustrated in FIG. 1, the gate driver 100 is a gate driver that drives an n-channel MOS transistor Q10 that is a power device, and is configured as an integrated circuit (IC).

The gate driver 100 includes a power supply line P (first power supply line) to which a voltage Vcc (first potential) is supplied from a power supply terminal OP, and a p-channel type MOS transistor Q1 (first transistor) and an n-channel type transistor Q2 (second transistor) connected in series with the ground line N (second power supply line) of the ground potential (second potential). The MOS transistors Q1 and Q2 operate in a complementary manner, and the connection node between the MOS transistor Q1 and the MOS transistor Q2 serves as an output node of the gate driver 100, from which a gate signal is output and the signal is input to the gate of the MOS transistor Q10.

A logic signal is input from the gate logic circuit LG to the gates of the MOS transistors Q1 and Q2. Note that the control signal IN is input to the gate logic circuit LG from the outside via the input terminal IT.

The gate driver 100 includes a power supply circuit PW and a switching circuit SWC that performs switching control for switching the output destination of the output voltage of the power supply circuit PW. The power supply circuit PW is a negative bias power supply that applies a negative bias to the source of the MOS transistor 10, and its output is connected to the node of the switch SW in the switching circuit SWC.

The switch SW switches whether the output voltage of the power supply circuit PW is input to the source of the MOS transistor Q10 or whether the source of the MOS transistor Q10 is connected to the ground (GND).

The switching circuit SWC controls the switch SW so that the source of the MOS transistor Q10 is connected to the ground at the timing when the gate driver 100 inputs the ON signal (HI) as the gate signal to the MOS transistor Q10.

Conversely, the switching circuit SWC is configured to control the switch SW such that the output voltage of the power supply circuit PW is applied to the source of the MOS transistor Q10 as the GND reference offset voltage Ve at the timing when the gate driver 100 inputs the off signal (LO) as the gate signal to the MOS transistor Q10.

The switching circuit SWC detects the HI and LO of the gate signal of the MOS transistor Q10 based on a logic signal output from a gate logic circuit LG, and controls the switch SW. The control signal for the switch SW is generated by a control circuit (not shown). The switch SW is controlled based on the logic signal; therefore, a control circuit with a simple configuration is sufficient. The switch SW may be composed of a MOS transistor or a bipolar transistor.

A smoothing capacitor SC is interposed between the power supply line P and the ground line N of the gate driver 100, and the source of the MOS transistor Q10 is connected to the ground line N. Note that a bypass capacitor C1 is interposed in the ground line N; therefore, the wiring inductance can be reduced during the transient operation when the MOS transistor Q10 is turned on and off.

The power supply circuit PW generates the offset voltage Ve based on the GND, and applies it to the source of the MOS transistor Q10 to use it as the source offset voltage Ve.

As described above, when the ON signal (HI) is input to the MOS transistor Q10, the offset voltage Ve is not applied to the source of the MOS transistor Q10, so the voltage Vcc is not offset and provided as the gate voltage Vg.

Figure 2:
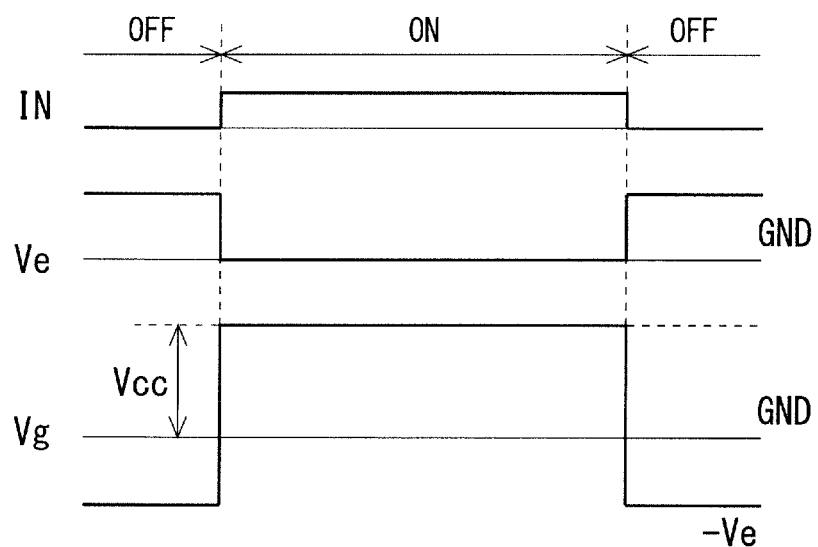
FIG. 2 is a diagram illustrating sequences of signals input to and output from the gate driver according to Embodiment 1 of the present invention.

FIG. 2 is a diagram illustrating sequences of signals input to the gate driver 100 and output from the gate driver 100. FIG. 2 illustrates the sequence of control signal IN input to the gate driver 100, a sequence of offset voltage Ve given from the power circuit PW, and a sequence of gate voltage Vg given from the gate driver 100.

As illustrated in FIG. 2, the MOS transistor Q10 is turned on and off in synchronization with the on and off of the control signal IN. When an off signal is input to the MOS transistor Q10, the offset voltage Ve is applied to the source of the MOS transistor Q10, so that the gate voltage Vg is lower than the GND potential by the offset voltage Ve. However, when the ON signal is input to the MOS transistor Q10, the offset voltage Ve is not applied to the source of the MOS transistor Q10, so it is sufficient that the gate voltage Vg gives the voltage Vcc. It is not necessary to apply a voltage obtained by adding the offset voltage Ve to the voltage Vcc, and it is not necessary to increase the maximum rating of the input power supply voltage of the gate driver.

The offset voltage Ve is generated as a voltage equal to or lower than the voltage Vcc in the power supply circuit PW. The timing at which the offset voltage Ve is applied is synchronized to the on and off timing of the gate of the MOS transistor Q10, thereby the potential difference between the gate and the source can be controlled. However, increase of the potential difference between the gate and the source by making the offset voltage Ve equal to the voltage Vcc, increases a forward voltage of the MOS transistor Q10 and makes the switching speed steep and requires a control circuit for speed adjustment, inviting increased costs. Therefore, the offset voltage Ve is made lower than the voltage Vcc, desirably 50% or lower of the voltage Vcc.

Figure 3:
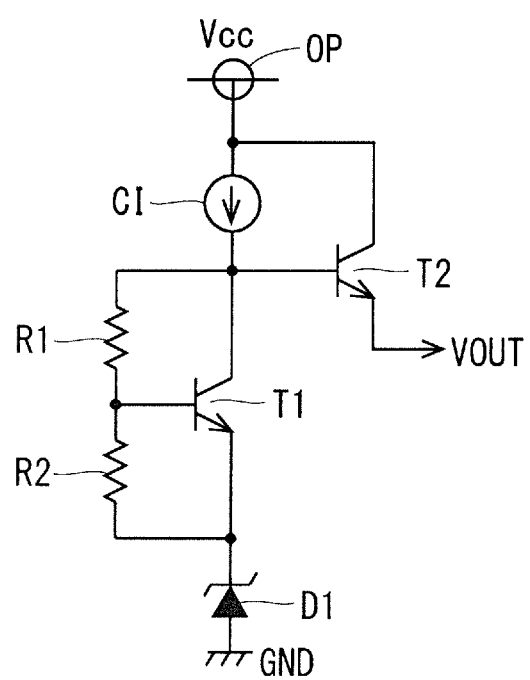
FIG. 3 is a diagram illustrating an example of a configuration of a power supply circuit.

An example of a configuration of a power supply circuit PW is illustrated in FIG. 3. As illustrated in FIG. 3, an npn transistor T1 is connected to the power supply terminal OP to which the voltage Vcc is supplied via the current source CI, the collector of the npn transistor T1 is connected to the output node of current source CI, the emitter is connected to the cathode of Zener diode D1, and the anode of the Zener diode D1 is grounded.

Resistors R1 and R2 connected in series are connected in parallel to the npn transistor T1 and the connection node of resistors R1 and R2 is connected to the base of the npn transistor T1.

Further, the power supply circuit PW is a transistor in which the collector of an npn transistor T2 is connected to power supply terminal OP, the base of the npn transistor T2 is connected to the output node of current source CI and is Darlington-connected to the npn transistor T1. The emitter of the npn transistor T2 is the output node VOUT of the power supply circuit PW.

The resistors R1 and R2 determine the voltage between the collector and the emitter of the npn transistor T1 by the resistance ratio, and a desired voltage and current can be obtained by the npn transistor T2 connected in Darlington connection.

As described above, the power supply circuit PW has a small configuration; therefore, even when the power supply circuit PW is built in the gate driver 100, the circuit scale of the gate driver 100 is not increased, and an increase in cost is suppressed.

Further, the switch SW of the switching circuit SWC switching the output destination of the power supply circuit PW can be configured on a small scale by using MOS transistors or bipolar transistors. With this, the output destination of the power circuit PW can be switched by adding simple switching logic. Thereby, costs reduction and securing quality for standardization of the manufacturing process are ensured by increasing the breakdown voltage level of the gate logic circuit LG or securing a variance margin of breakdown voltage.

At the timing when the MOS transistor Q10 is turned off, a negative bias (reverse bias) is applied to the gate of the MOS transistor Q10. The rise time (charge time) until the negative bias reaches a predetermined voltage depends on the sink current capability (Qsink) of the gate driver 100 and the source current capability (Qsouce) of the power supply circuit PW. Therefore, by setting at least Qsoucesink, the rise time can be shortened and the MOS transistor Q10 can be turned off quicker.

The voltage generated by the power supply circuit PW is used as the offset voltage Ve of the source of the MOS transistor Q10. The power supply circuit PW needs voltage control with several tens of nsec order because of the necessity for the operation to synchronize the timing of applying the offset voltage Ve to the on and off timing of the gate of the MOS transistor Q10. For this reason, the power source circuit PW is required to have a source current capability rather than a sink current capability.

Although, the gate voltage of MOS transistor Q10 is controlled by Qsouce and Qsink, the gate voltage can also be controlled by applying an offset voltage to the source of the MOS transistor Q10 using an independently controllable power supply circuit PW (negative bias power supply). This enables gate voltage control in two systems, increases accuracy of output speed adjustment of MOS transistor Q10, reduces EMC noise by dV/dt control, etc. and enables standardization of the structure of MOS transistor Q10, leading to expectations of improvement in quality and reduction in manufacturing cost.

Embodiment 2

Figure 4:
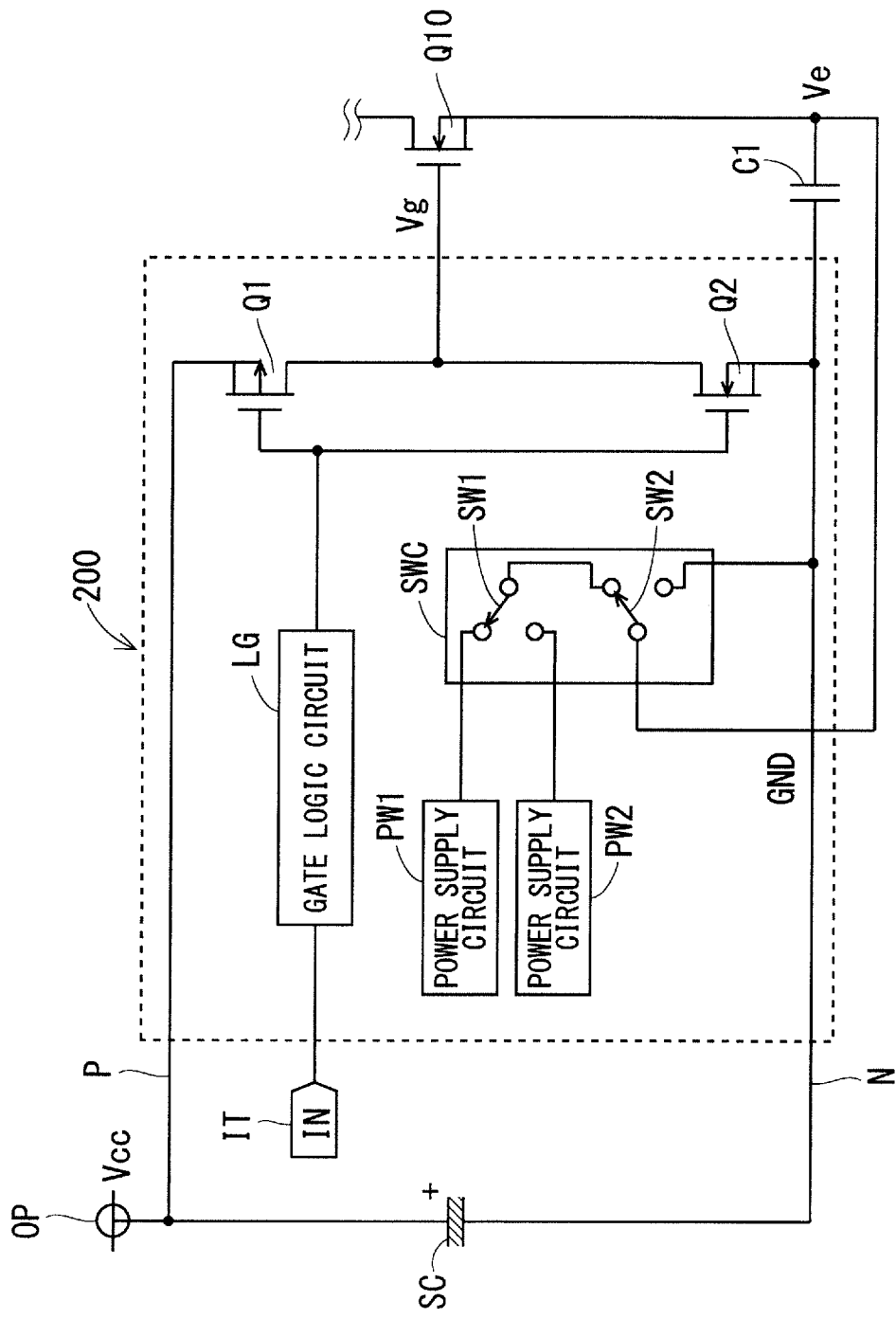
FIG. 4 is a circuit diagram illustrating a configuration of a gate driver according to Embodiment 2 of the present invention.

FIG. 4 is a circuit diagram illustrating a configuration of a gate driver 200 according to Embodiment 2 of the present invention. It should be noted that, in FIG. 4, the same components as those of the gate driver 100 described with reference to FIG. 1 are denoted with the same reference numerals, and overlapping descriptions are omitted.

As illustrated in FIG. 4, the gate driver 200 includes power supply circuits PW1 and PW2 and a switching circuit SWC for switching output destinations of the power supply circuits PW1 and PW2. The power supply circuits PW1 and PW2 are negative bias power supplies, and each output is connected to two nodes of the switch SW1 in the switching circuit SWC, respectively.

The switches SW1 and SW2 switch the outputs of power supply circuits PW1 and PW2 to connect either to the source of MOS transistor Q10 or to ground (GND). The switching circuit SWC controls the switch SW1 to switch from the output of the power supply circuit PW1 to the output of the power supply circuit PW2 at the timing when the gate driver 200 inputs the ON signal (HI) as the gate signal to the MOS transistor Q10, and connects the switch SW2 to the ground after a lapse of a certain time after the MOS transistor Q10 is turned on. As a result, the output voltage Vp2 of the power supply circuit PW2 is switched to 0V (LO) stepwise.

Prior to the timing at which the gate driver 200 inputs an off signal (LO) as a gate signal to the MOS transistor Q10, conversely, the switching circuit SWC connects the output of the power supply circuit PW2 to the source of the MOS transistor Q10, then, the switching circuit SWC connects the output of the power supply circuit PW1 to the source of the MOS transistor Q10 after a certain time has elapsed. As a result, the output voltage Vp2 of the power supply circuit PW2 switches to the output voltage Vp1 of the power supply circuit PW1 stepwise.

The power supply circuits PW1 and PW2 may have the same configuration as that of the power supply circuit PW described with reference to FIG. 3. Further, the number of power supply circuits is not limited to two, and two or more power supply circuits may be provided.

FIG. 5 is a diagram illustrating sequences of signals input to and output from the gate driver 200 and the sequences of a control signal IN input to the gate driver 200, the output voltage Vp1 of the power supply circuit PW1 output from the gate driver 200, the output voltage Vp2 of the power supply circuit PW2, and the gate voltage Vg are illustrated.

As illustrated in FIG. 5, the MOS transistor Q10 is turned on and off in synchronization with the on and off of the control signal IN. When an off signal is input to the MOS transistor Q10, the output voltage Vp1 of the power supply circuit PW1 is applied as the offset voltage Ve to the source of the MOS transistor Q10; therefore, the gate voltage Vg is lower than the GND potential by the offset voltage Ve. However, when an ON signal is input to the MOS transistor Q10, the offset voltage Ve applied to the source of the MOS transistor Q10 is lowered in accordance with the output voltage Vp2 of the power supply circuit PW2. Thereafter, the offset voltage Ve is not applied to the source of the MOS transistor Q10. For this reason, it is sufficient that the gate voltage Vg gives the voltage Vcc and it is not necessary to apply a voltage obtained by adding the offset voltage Ve to the voltage Vcc, and it is not necessary to increase the maximum rating of the input power supply voltage of the gate driver.

Further, the offset voltage Ve changes in accordance with the on and off of the MOS transistor Q10 stepwise; therefore, the accuracy of the gate voltage control can be improved, and the accuracy of the speed adjustment of the output of the MOS transistor Q10 can be further increased.

Embodiment 3

The gate driver 100 and the gate driver 200 of Embodiments 1 and 2 described above can be mounted on a semiconductor module as a driver IC.

Figure 6:
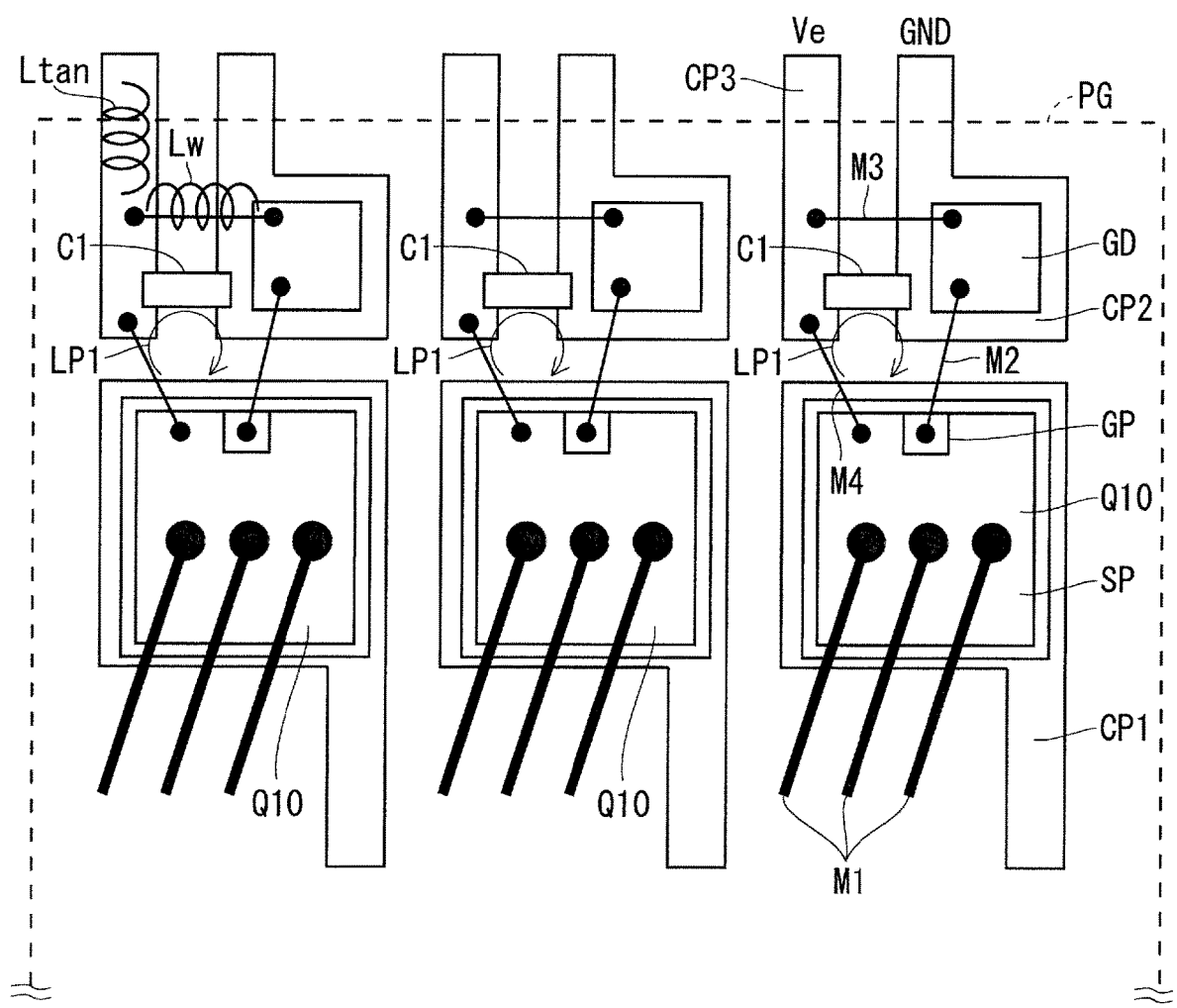
FIG. 6 is a partial plan view illustrating an inner configuration of a semiconductor module according to Embodiment 3 of the present invention.

FIG. 6 is a partial plan view illustrating an inner configuration of a semiconductor module 1000 according to Embodiment 3 of the present invention. As illustrated in FIG. 6, the semiconductor module 1000 is a module packaged with the MOS transistor Q10 using the gate driver 100 or the gate driver 200 as the gate driver GD. Note that in FIG. 6, the sealing resin and the like are not illustrated for convenience, but a package region PG sealed with the sealing resin is surrounded by a broken line, and outside this region is outside the module.

As illustrated in FIG. 6, the semiconductor module 1000 is a module in which three MOS transistors Q10 are packaged. The three MOS transistors Q10 are modules that are connected in parallel to each other at a portion that is not illustrated in the drawing to obtain a large output current. Note that the number of MOS transistors 10 is not limited to three, and the arrangement is not limited to a horizontal arrangement.

Each of the three MOS transistors Q10 is mounted on a conductor frame CP1, and a plurality of wires M1 are connected to the source electrode pad SP on the upper surface. A drain electrode is provided on the side facing the conductor frame CP1.

Each of conductor frames CP2 and CP3 is provided so as to oppose the conductor frame CP1 in plan view, and a gate driver GD is mounted as a driver IC on the conductor frame CP2. It should be noted that, the conductor frame CP2 serves as a GND terminal.

The output node of the gate driver GD and the gate electrode pad GP of the MOS transistor Q10 are connected by a wire M2, and a gate voltage is applied to the gate of the MOS transistor Q10 via the wire M2.

The offset voltage Ve output from the power supply circuit in the gate driver GD is given to the conductor frame CP3 via the wire M3. The conductor frame CP3 is an offset voltage terminal that applies an offset voltage Ve to the source of the MOS transistor Q10.

An end of the conductor frame CP3 and the source electrode pad SP of the MOS transistor Q10 are connected by a wire M4, and the offset voltage Ve is applied to the source of the MOS transistor Q10 through the wire M4.

A bypass capacitor C1 is provided between the conductor frame CP2 and the conductor frame CP3.

As illustrated in FIG. 6, the bypass capacitor C1 is provided inside the module, and the offset voltage terminal CP3 and the GND terminal CP2 are arranged in juxtaposition. Thereby, the relationship between the wiring inductance Ltan of the offset voltage terminal CP3 and the wiring inductance Lw of the wire M3 can be Lw>Ltan.

As a result, a loop for applying the gate voltage to the gate of the MOS transistor Q10 (gate charge loop) is a small loop composed of the loop LP1 from the source of the MOS transistor Q10 through the wire M4, the bypass capacitor C1, and the conductor frame CP2. For this reason, suppression of the gate surge of the MOS transistor Q10 is ensured.

Figure 7:
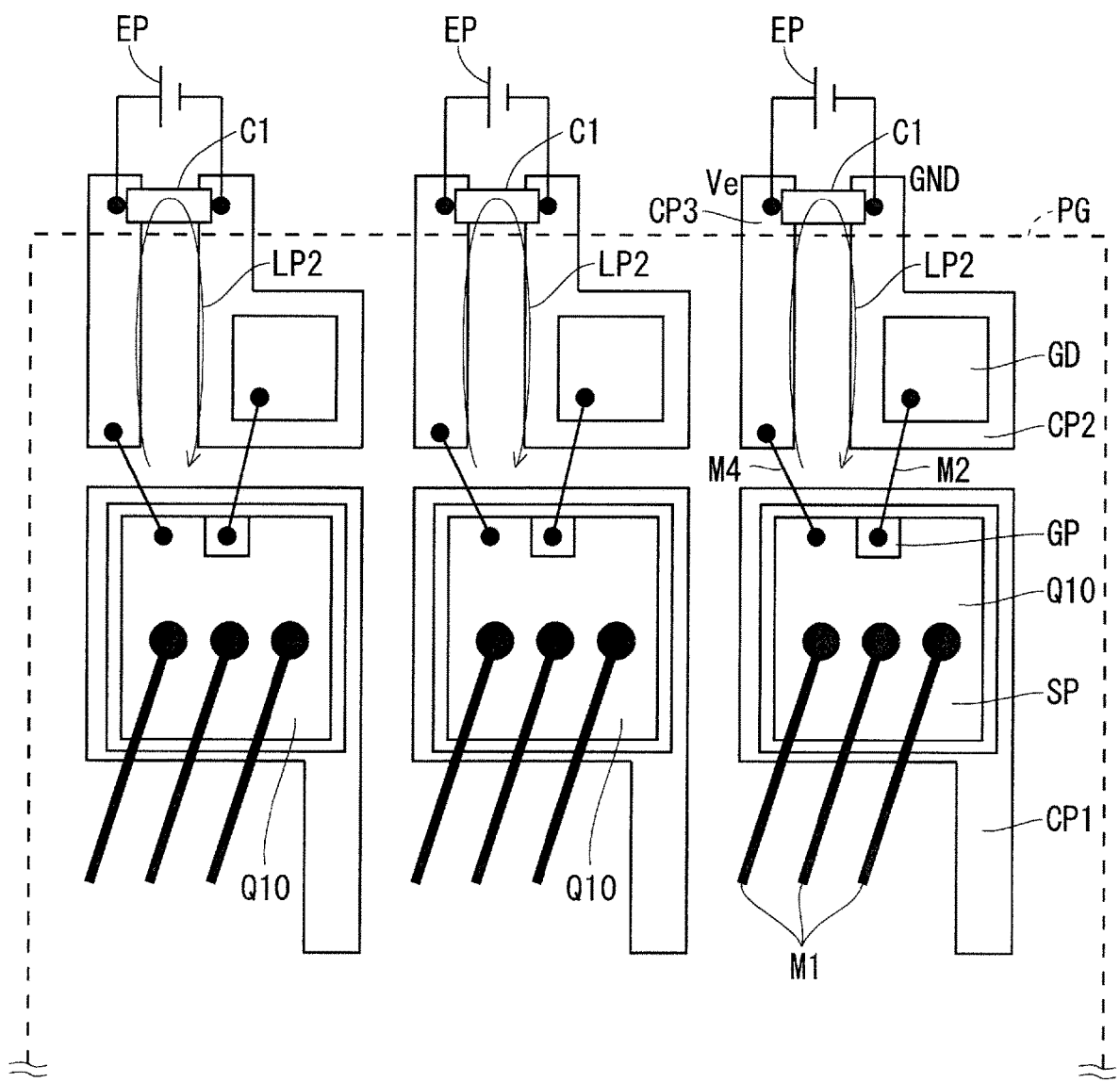
FIG. 7 is a partial plan view illustrating an inner configuration of a conventional semiconductor module.

FIG. 7 illustrates a conventional configuration in which the bypass capacitor C1 is provided outside the module and a negative bias is applied from outside the module. In FIG. 7, an external power supply EP is connected between the conductor frames CP2 and CP3. When a negative bias is applied from the external power supply EP, a conventional configuration in which the gate driver GD does not include a power supply circuit and a switching circuit is employed. In such a conventional configuration, the gate charge loop is a large loop LP2 as illustrated in FIG. 7, and the gate surge may increase.

The gate voltage of MOS transistor Q10 is controlled by applying an offset voltage to the source of the MOS transistor Q10 using an independently controllable power supply circuit PW as well as it is controlled by Qsouce and Qsink as described earlier, which ensures the gate voltage control by two systems; therefore, the gate surge can also be suppressed by suppressing the current peak in each system.

That is, in a case where gate voltage control is performed by one system in which the gate voltage of the MOS transistor Q10 is controlled by Qsouce and Qsink, when the gate voltage Vg is controlled at high speed, it is necessary to supply a current and sink the current only in this system. At this time, the time change (di/dt) of the gate current becomes steep, and an excessive surge is superimposed on the inductance of the gate charge loop.

Thus, the gate surge is determined by the di/dt of the gate current and the inductance of the gate charge loop. To suppress this, the gate voltage control in two systems suppresses the current peak in each system, and the gate surge can be suppressed by reducing the current di/dt.

Also, a gate surge can be suppressed by forming a small gate charge loop as in the loop LP1 described with reference to FIG. 6.

In addition, when performing gate voltage control in two systems, Qsource and Qsink can be set high in order to operate the MOS transistor Q10 at high speed. That is, there is a system that controls the gate voltage by applying an offset voltage to the source of the MOS transistor Q10, and suppressing the current peak in this system; therefore, even if Qsource and Qsink are set high, an excessive gate surge does not occur. Note that, in order to set Qsource and Qsink high, the size of the MOS transistor Q10 is increased by increasing the gate width of the MOS transistor Q10.

Further, when the gate surge of the MOS transistor Q10 is suppressed, the carrier frequency characteristic of the MOS transistor Q10 is improved. That is, when the gate surge is suppressed, the restriction on the current of the gate charge loop determined by the gate surge is relaxed. As a result, the gate voltage of the MOS transistor Q10 can be controlled more steeply, the switching loss of the MOS transistor Q10 is reduced, the temperature rise accompanied by the switching loss is suppressed, and the carrier frequency characteristic is improved.

Improvement in the carrier frequency characteristic of the MOS transistor Q10 leads to reduction in size and cost of passive elements such as coils.

<Application to Silicon Carbide Semiconductor Device>

The MOS transistor Q10 to be controlled in Embodiments 1 to 3 described above is not limited to a silicon (Si) transistor, but the MOS transistor Q10 may be a wide band gap semiconductor transistor using a wide band gap semiconductor of such as silicon carbide (SiC) or gallium nitride (GaN).

In the wide band gap semiconductor transistor, the on-resistance can be reduced by reducing the threshold voltage; therefore, the wide band gap semiconductor transistor is advantageous in that the cost reduction effect accompanied by chip shrink is higher than that of the Si transistor.

The wide band gap semiconductor transistor is also advantageous in that it can be used at high temperatures and under high breakdown voltages.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A gate driver configured to drive a gate of a transistor, comprising:
    a first transistor and a second transistor connected in series between a first power supply line to which a first potential is applied and a second power supply line to which a second potential lower than the first potential is applied, connection nodes thereof are output nodes of the gate driver, the first transistor and the second transistor being configured to operate in a complementary manner;
    a power supply circuit for applying an offset voltage to a source of the transistor; and
    a switching circuit for performing switching control to apply the offset voltage output from the power supply circuit to the source of the transistor or to apply the second potential to the source of the transistor, wherein
    the switching circuit is configured to switch so as to apply the offset voltage to the source of the transistor in accordance with a timing of turning off the gate of the transistor and to apply the second potential to the source of the transistor in accordance with a timing of turning on the gate of the transistor.

2. The gate driver according to claim 1, wherein
    the power supply circuit includes a plurality of power supply circuits,
    each of the plurality of power supply circuits has a different output voltage, and
    the switching circuit is configured to switch each of the output voltages of the plurality of power supply circuits and apply the output voltages to the source of the transistor in accordance with a timing of turning off the gate of the transistor, so as to increase the offset voltage stepwise.

3. The gate driver according to claim 1, further comprising
    a logic circuit configured to output a logic signal which controls on and off of the first transistor and the second transistor, wherein
    the switching circuit is configured to perform the switching control based on the logic signal.

4. The gate driver according to claim 1, wherein
    a capacitor is interposed between the second power supply line and the source of the transistor.

5. The gate driver according to claim 1, wherein
    the transistor includes a wide-band-gap semiconductor transistor.

6. A semiconductor module, comprising:
    a gate driver according to claim 1;
    the transistor;

a capacitor interposed between the second power supply line and the source of the transistor;
a ground terminal on which the gate driver is mounted; and
an offset voltage terminal electrically connected to the source of the transistor, wherein
the ground terminal and the offset voltage terminal are arranged in juxtaposition,
the offset voltage output from the power supply circuit is given to the offset voltage terminal via a wire, and
the capacitor is connected between the ground terminal and the offset voltage terminal.

\* \* \* \* \*